United States Patent [19]

Morimoto et al.

[11] Patent Number: 4,951,290
[45] Date of Patent: Aug. 21, 1990

[54] SEMICONDUCTOR LASER DEVICE

[75] Inventors: Taiji Morimoto, Nara; Masahiro Yamaguchi, Tokai; Shinji Kaneiwa, Nara; Hiroshi Hayashi, Kyoto; Hidenori Kawanishi, Higashiosaka, all of Japan

[73] Assignee: Sharp Kabushiki Kaisha, Osaka, Japan

[21] Appl. No.: 215,619

[22] Filed: Jul. 6, 1988

[30] Foreign Application Priority Data

Jul. 10, 1987 [JP] Japan .................. 62-173294
Jan. 19, 1988 [JP] Japan .................. 63-8749

[51] Int. Cl.$^5$ .................................................. H01S 3/19
[52] U.S. Cl. ........................................ 372/48; 372/45; 372/46
[58] Field of Search ............... 372/48, 46, 45, 44, 372/43

[56] References Cited

U.S. PATENT DOCUMENTS 4,523,317  6/1985  Botez .................................. 372/48
4,745,611  5/1988  Hamada et al. ................... 372/46
4,819,245  4/1989  Morimoto et al. ................ 372/48

Primary Examiner—William L. Sikes
Assistant Examiner—Georgia Y. Epps
Attorney, Agent, or Firm—Irell & Manella

[57] ABSTRACT

A semiconductor laser device comprising an active layer that constitutes a laser-oscillating resonator, and an inner-striped channel in the resonating direction, light from the active layer being absorbed at both edges of the striped channel, resulting in an optical waveguide within the active layer, wherein the amount of light to be absorbed at both edges of the striped channel in the vicinity of at least one of the light-emitting facets is smaller than that to be absorbed at both edges of the striped channel inside of the light-emitting facets.

2 Claims, 4 Drawing Sheets

SEMICONDUCTOR LASER DEVICE,

BACKGROUND OF THE INVENTION

1. Field of the invention:

This invention relates to a semiconductor laser device that suppresses the generation of heat on at least one light-emitting facet.

2. Description of the prior art:

Conventional semiconductor laser devices are classified into two groups, one of which is of a gain guided-type and the other of which is of an index guided-type, based on the optical waveguiding mechanism. The index guided semiconductor laser devices are more useful from the practical viewpoint, because of the stability of the transverse mode that is important in practical use. A number of structures for index guided semiconductor laser devices have been developed. Especially, inner stripe semiconductor laser devices with a channeled substrate have been put into practical use because of the ease of their manufacture and their high yield. As examples of this kind of structure, there are VSIS (V-channeled substrate inner stripe) semiconductor laser devices, CSP (channeled substrate planar) semiconductor laser devices, and BTRS (buried twin ridge substrate) semiconductor laser devices.

FIG. 7A shows a VSIS semiconductor laser device, which is produced as follows: On a p-GaAs substrate 10, an n-GaAs current blocking layer 22 is formed. Then, a V-channel 3 is formed in a manner to reach the substrate 10 through the current blocking layer 22, resulting in a current path. Then, on the current blocking layer 22 including the channel 3, a p-$Ga_{1-y}Al_yAs$ cladding layer 11, a flat p-$Ga_{1-x}Al_xAs$ active layer 12, and an n-$Ga_{1-y}Al_yAs$ cladding layer 13 are successively formed. Then, on the cladding layer 13, an n-GaAs cap layer 14 for obtaining an ohmic contact is formed. The channel 3 functions to confine current therein and also creates an optical waveguide defined by the channel width within the active layer. Thus, in this VSIS semiconductor laser device, light of the active layer 12 on the outside of the channel 3 is absorbed by the n-GaAs current blocking layer 22, so that an effective refraction index distribution can be formed within the active layer, resulting in an indexguided structure (i.e., an optical waveguide) within the active layer 12. The said optical waveguide suppresses the high-order transverse mode gain, even with a channel width as wide as 4–7 μm, and laser oscillation can be attained in the fundamental transverse mode even with high output power.

FIG. 7B shows a CSP semiconductor laser device, which is produced as follows: A U-shaped channel 4 is formed in an n-GaAs substrate 30, after which an n-$Ga_{1-x}Al_xAs$ cladding layer 31, a flat $Ga_{1-x}Al_xAs$ active layer 32, and a p-$Ga_{1-y}Al_yAs$ cladding layer 33 are successively formed on the substrate 30 including the channel 4. Then, an n-GaAs cap layer 34 is formed on the cladding layer 33. A p-diffusion region 35 is then formed over the channel 4 from the top of the cap layer 34 to the middle of the cladding layer 33, resulting in a current path. The channel 4 creates an optical waveguide defined by the channel width within the active layer 32. That is, an index guided structure is formed within the active layer 32 based on an effective refraction index distribution formed in the active layer 32. Because the active layer 32 is close to the n-GaAs substrate 30 at the outside of the channel 4, the light of the active layer 32 is absorbed by the n-GaAs substrate 30, and even if the channel width is as wide as 4–7μm, the gain of a high-order transverse mode is suppressed, and this CSP semiconductor laser device can oscillate the laser in the fundamental transverse mode up to a high output power.

FIG. 7C shows a BTRS semiconductor laser device, which is produced as follows: On a p-GaAs substrate 60 with a ridge 60a formed in the resonating direction in the center thereof, an n-GaAs current blocking layer 65 is formed. Then, a U-shaped channel 67 is formed in the n-GaAs current blocking layer 65 in a manner to reach the ridge 60a of the p-GaAs substrate 60 through the current blocking layer 65. Then, on the current blocking layer 65 including the channel 67, a p-$Ga_{1-y}Al_yAs$ cladding layer 61, a $Ga_{1-x}Al_xAs$ active layer 62, an n-$Ga_{1-y}Al_yAs$ cladding layer 63, and an n-GaAs contact layer 64 are successively formed. The channel 67 of this BTRS laser device creates an optical waveguide (i.e., an index guided structure based on the effective refraction index distribution) defined by the channel width within the active layer 62, as well. The light of the active layer 62 is absorbed by the n-GaAs current blocking layer 65 at the outside of the channel 67, and this BTRS laser device can oscillate a laser in the fundamental transverse mode even with a high output power.

However, with these conventional semiconductor laser devices with inner stripes, because light is absorbed at both edges of the channel, even at times of high output power operation, there is an increase in the amount of light that is absorbed in the direction of the substrate with an increase in the amount of light resonating in the optical waveguide of the active layer that functions as a resonator, and because of that increase in the amount of heat absorbance, heat generated at both edges of the channel in the vicinity of the light-emitting facets becomes large. For example, the temperature of both edges thereof in the vicinity of the facets becomes about 200°C. at a 30 mW operation. With conventional semiconductor laser devices, the optical power density becomes the greatest at the light-emitting facets, and accordingly an increase in the temperature of the laser devices becomes the greatest at the light-emitting facets, causing deterioration of the laser devices at the said light-emitting facets, which limits the lifespan of the laser devices.

SUMMARY OF THE INVENTION

The semiconductor laser device of this invention, which overcomes the above-discussed and numerous other disadvantages and deficiencies of the prior art, comprises an active layer that constitutes a laser-oscillating resonator, and an inner-striped channel in the resonating direction, light from said active layer being absorbed at both edges of said striped channel, resulting in an optical waveguide within said active layer, wherein the amount of light to be absorbed at both edges of said striped channel in the vicinity of at least one of the light-emitting facets is smaller than that to be absorbed at both edges of said striped channel inside of the light-emitting facets.

In a preferred embodiment, the composition ratio of the mixed crystal constituting the edges of said striped channel in the vicinity of at least one of the facets is different from that of the mixed crystal constituting the edges of said striped channel inside of the facets.

Thus, the invention described herein makes possible the objectives of (1) providing a semiconductor laser device that has a long life-span because the generation of heat in the vicinity of the light-emitting facets of the laser device is suppressed; and (2) providing a semiconductor laser device in which the generation of heat in the vicinity of the light-emitting facets of the laser device is suppressed, and the deterioration of the laser device can be prevented, thereby attaining stable laser oscillation for a long period of time.

BRIEF DESCRIPTION OF THE DRAWING

This invention may be better understood and its numerous objectives and advantages will become apparent to those skilled in the art by reference to the accompanying drawing as follows.

DESCRIPTION OF THE PREFERRED EMBODIMENTS

EXAMPLE 1

Figure 1:
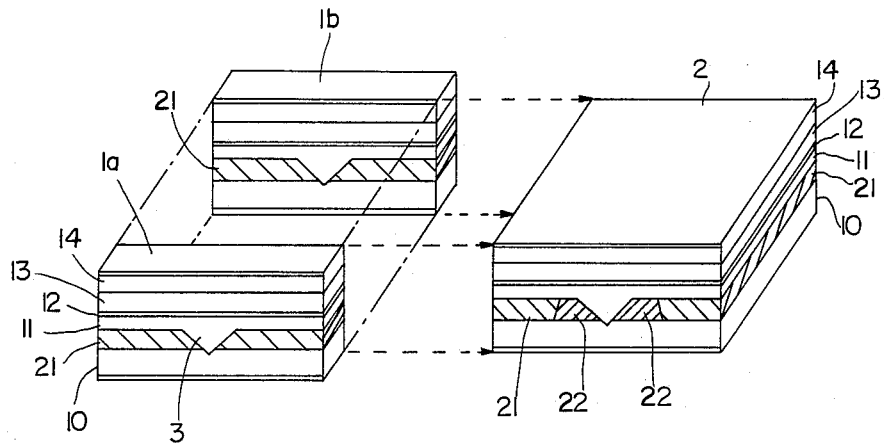
FIG. 1 is a perspective view showing the decomposition of a semiconductor laser device of this invention.

FIG. 1 shows a VSIS semiconductor laser device of this invention in which the current blocking layer 21 in the vicinity of the light-emitting facets 1a and 1b is made of n-$Ga_{1-z}Al_zAs$ and the current blocking layer 22 inside of the light-emitting facets 1a and 1b is made of n-GaAs, so that the light absorbance of the current blocking layer in the vicinity of the light-emitting facets 1a and 1b becomes small, resulting in a suppression of the generation of heat in the vicinity of the light-emitting facets 1a and 1b. The light absorbance of the n-$Ga_{1-z}Al_zAs$ compound semiconductor is smaller than that of the n-GaAs compound semiconductor.

Figure 2A:
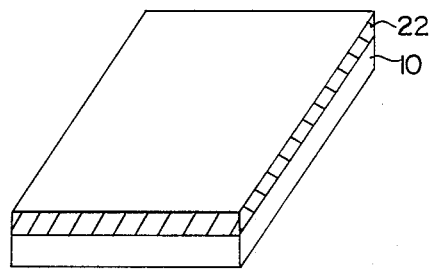
FIGS. 2A to 2D are schematic diagrams showing a production process of the semiconductor laser device shown in FIG. 1.

This VSIS semiconductor laser device is produced as follows: As shown in FIG. 2A, on the (100) plane of a p-GaAs substrate 10, an n-GaAs current blocking layer 22 with a thickness of 0.8 μm is epitaxially grown. Then, as shown in FIG. 2B, the n-GaAs current blocking layer 22 is etched to form a mesa 5 at the position of 15 μm from each of the laseroscillating facets. The mesa 5 has a width of 8 μm, a length of 220 μm in the resonating direction, and a height of 0.8 μm. Then, an n-$Ga_{1-z}Al_zAs$ current blocking layer 21 with a thickness of 0.8 μm is epitaxially grown outside of the mesa 5. Since the width of the mesa 5 is narrow, the n-$Ga_{1-z}Al_zAs$ current blocking layer 21 is only grown on the p-GaAs substrate 10 outside of the mesa 5, but it is not grown on the mesa 5, resulting in an epitaxial layer with a flat surface.

Figure 2C:
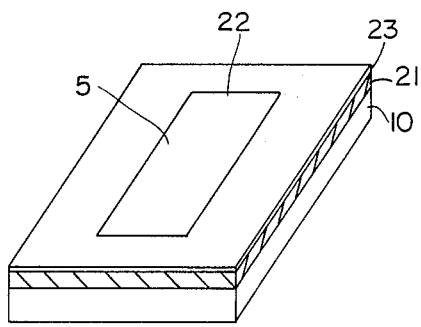
Figure 2B:
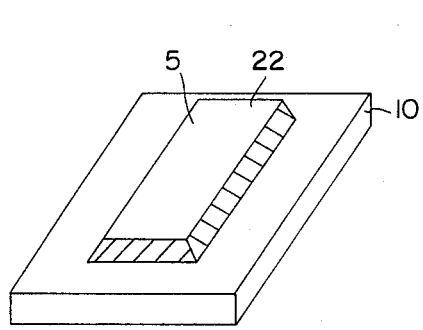
Figure 2D:
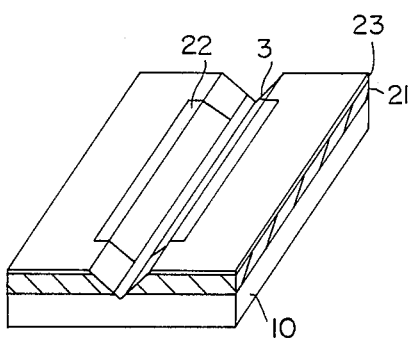

Then, as shown in FIG. 2C, an undoped GaAs layer 23 with a thickness of 0.05 μm that is to be etched back in the succeeding process is formed by liquid phase epitaxy so as to smoothly carry out the succeeding epitaxial growth process. Then, a V-channel 3 with a width of 4 μm and a depth of 1 μm is formed in the resonating direction in a manner to reach the substrate 10 through the GaAs layer 23, the current blocking layer 21 and the mesa 5. On the GaAs layer 23 including the channel 3, a p-$Ga_{1-y}Al_yAs$ cladding layer 11, a p-$Ga_{1-x}Al_xAs$ active layer 12, an n-$Ga_{1-y}Al_yAs$ cladding layer 13 (wherein y>x), and an n-GaAs cap layer 14 are successively formed by liquid phase epitaxy. During this growth process, the GaAs layer 23 is etched back and dissolved into the p-$Ga_{1-y}Al_yAs$ cladding layer 11, resulting in such a semiconductor laser device as shown in FIG. 1.

The portions of both edges of the channel 3 inside of the facets of the laser device are formed by n-GaAs and the portions of both edges of the channel 3 in the vicinity of the facets are formed by n-$Ga_{1-z}Al_zAs$. Since the amount of light to be absorbed by the n-GaAs current blocking layer 22 at both edges of the channel 3 inside of the facets 1a and 1b of the laser device is greater than that of light to be absorbed by the n-$Ga_{1-z}Al_zAs$ current blocking layer 21 at both edges of the channel 3 in the vicinity of the facets 1a and 1b, the optical waveguiding mechanism of the active layer 12 strongly operates inside of the facets, resulting in stabilized laser oscillation in the fundamental transverse mode. Moreover, the generation of heat in the vicinity of the facets can be suppressed.

It was observed that the above-mentioned semiconductor laser device did not deteriorate even at continuous operation at a 50 mW optical output power at room temperatures.

EXAMPLE 2

Figure 3:
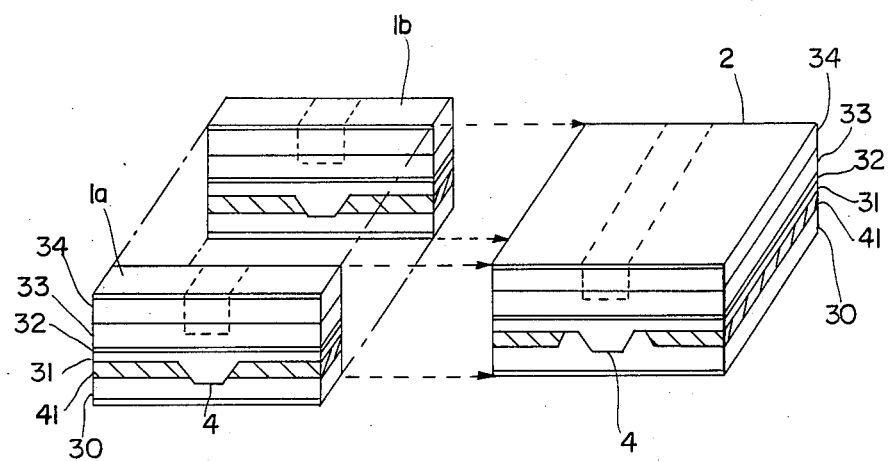
FIG. 3 is a perspective view showing the decomposition of another semiconductor laser device of this invention.

FIG. 3 shows a CSP semiconductor laser device of this invention, in which both edges of the channel 4 in the vicinity of the light-emitting facets 1a and 1b are constituted by an n-$Ga_{1-z}Al_zAs$ current blocking layer 41 and both edges of the channel 4 inside of the facets 1a and 1b are constituted by an n-GaAs substrate 30. Thus, for the same reasons as mentioned in Example 1, the amount of light to be absorbed by the substrate in the vicinity of the facets is minimized, so that the deterioration of the semiconductor laser device can be suppressed. The semiconductor laser device of this example is produced in the same way as that shown in FIGS. 2A to 2D, in which a mesa 5 is formed in the center of the n-GaAs substrate 30 by an etching technique, and an n-$Ga_{1-z}Al_zAs$ current blocking layer 41 is formed at the outside of the mesa 5.

EXAMPLE 3

Figure 4:
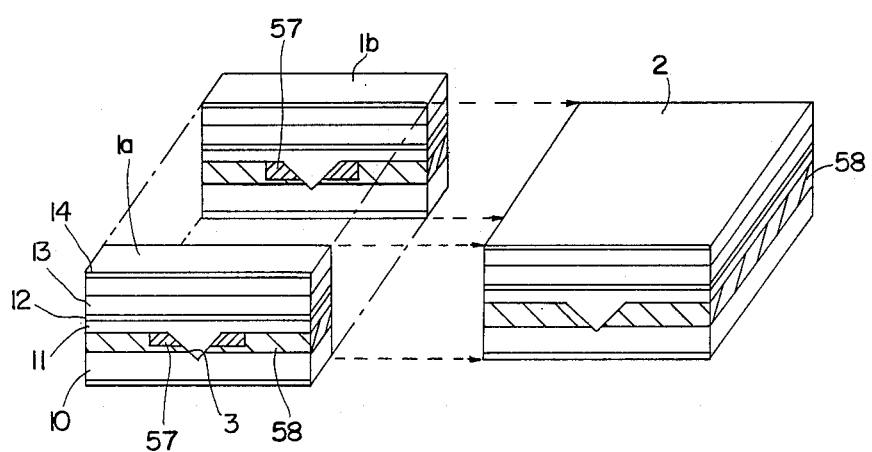
FIG. 4 is a perspective view showing the decomposition of another semiconductor laser device of this invention.

FIG. 4 shows another VSIS semiconductor laser device of this invention, in which the active layer 12 is made of p-$Ga_{1-x}Al_xAs$, and the cladding layers 11 and 13, respectively, are made of p-$Ga_{1-y}Al_yAs$ and n-$Ga_{1-y}Al_yAs$. Both edges of the channel 3 in the vicinity of the light-emitting facets 1a and 1b are constituted by the current blocking layer 57 of n-$Ga_{1-z}Al_zAs$, the AlAs mole fraction z of which is larger than the AlAs mole fraction x of the p-$Ga_{1-x}Al_xAs$ active layer 12 (i.e., the forbidden bandgap of the n-$Ga_{1-z}Al_zAs$ current blocking layer 57 is greater than that of the p-Ga$_{1-x}$Al$_x$As active layer 12), whereas both edges of the channel 3 inside of the facets 1a and 1b are constituted by the current blocking layer 58 of n-GaAl.

Figure 5A:
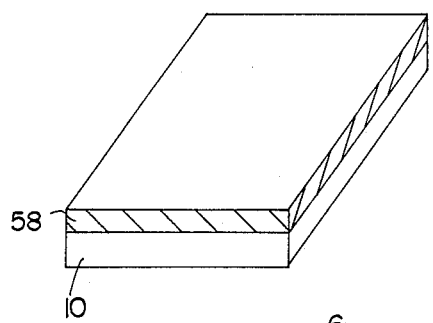
FIGS. 5A to 5D are schematic diagrams showing a production process of the semiconductor laser device shown in FIG. 4.

The semiconductor laser device of this example is produced as follows: As shown in FIG. 5A, on the (100) plane of a p-GaAs substrate 10, an n-GaAs current blocking layer 58 with a thickness of 0.8 μm is formed. Then, as shown in FIG. 5B, pits 6 with a width of 7 μm in the direction vertical to the resonating direction, a length of 20 μm in the resonating direction, and a depth of 0.6 μm are formed by an etching technique in the portions of the current blocking layer 58 including the facets of the semiconductor laser device.

Figure 5C:
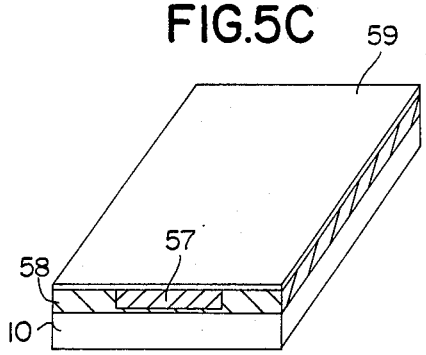
Figure 5B:
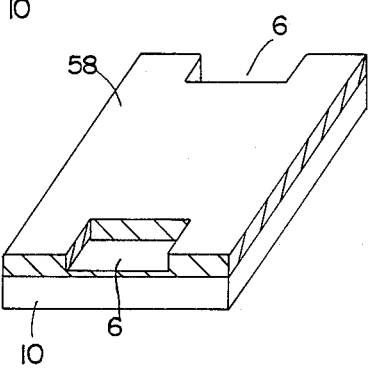

Then, as shown in FIG. 5C, an n-Ga$_{1-z}$Al$_z$As current blocking layer 57 (wherein z>x), the forbidden bandgap of which is greater than that of the active layer 12 to be formed in the succeeding step, is formed within each of the pits 6, after which an undoped GaAs layer 59 with a thickness of 0.05 μm that is to be etched back in the succeeding step is formed on the current blocking layers 57 and 58. It is preferable that the n-Ga$_{1-z}$Al$_z$As current blocking layer 57 is formed only within the pits 6 so that light of the active layer can be absorbed by the portion of the substrate 10 that is positioned inside of the facets, thereby attaining stabilized oscillation in a transverse mode. However, even when the n-Ga$_{1-z}$Al$_z$As current blocking layer 57 is formed on the n-GaAs current blocking layer 58 other than the n-Ga$_{1-z}$Al$_z$As current blocking layer 57, if the thickness of the n-Ga$_{1-z}$Al$_z$As current blocking layer 57 is so thin that light can reach the n-GaAs current blocking layer 58 through the n-Ga$_{1-z}$Al$_z$As current blocking layer 57, the fundamental transverse-mode can be stabilized and stabilized oscillation in a transverse mode can be attained.

Figure 5D:
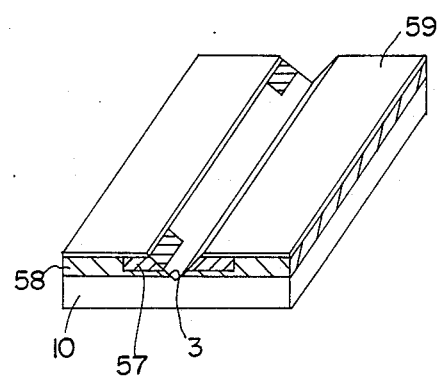

Thereafter, as shown in FIG. 5D, a V-channel 3 with a width of 4 μm and a depth of 1 μm is formed in the resonating direction. On the undoped GaAs layer 59 including the channel 3, as shown in FIG. 4, a p-Ga$_{l-y}$Al$_y$As cladding layer 11, a p-Ga$_{l-x}$Al$_x$As active layer 12, an p-Ga$_{l-y}$Al$_y$As cladding layer 13, and an n-GaAs cap layer 14 are successively formed by an epitaxial growth technique, resulting in a semiconductor laser device. In this growth step, the undoped GaAs layer 59 is etched back and dissolved into the p-Ga$_{l-y}$Al$_y$As cladding layer 11.

The current blocking layer 58 at both edges of the channel 3 inside of the facets of the semiconductor laser device obtained is made of n-GaAs and the current blocking layer 57 at both edges of the channel 3 in the vicinity of the facets is made of n-n-Ga$_{1-z}$Al$_z$As. The n-GaAs current blocking layer 58 at the inside of the facets more effectively absorbs the light from the active layer 12 than the current blocking layer 57 in the vicinity of the facets, so that light can be stably confined within the active layer 12 inside of the facets, thereby attaining laser oscillation in a stabilized fundamental transverse mode. On the other hand, the n-Ga$_{1-z}$Al$_z$As current blocking layer 57 that is disposed at both edges of the channel 3 in the vicinity of the facets has an AlAs mole fraction that is greater than that of the p-Ga$_{l-x}$Al$_x$As active layer 12 (that is, z>x), and the forbidden bandgap of the n-Ga$_{1-z}$Al$_z$As current blocking layer 57 is greater than that of the active layer 12, so that the amount of light from the active layer 12 that is absorbed by the n-Ga$_{1-z}$Al$_z$As current blocking layer 57 becomes smaller than the amount of light from the active layer 12 that is absorbed by the n-GaAs current blocking layer 58. As a result, the generation of heat in the vicinity of the facets of the laser device is suppressed. Moreover, the n-Ga$_{1-z}$Al$_z$As current blocking layer 57 is of an n-type so that current can be effectively confined within the channel 3.

It was observed that the temperature of this semiconductor laser device was not elevated, but it was maintained at room temperatures (25° C.), even at times of operation at 30 mW and that the generation of heat in the vicinity of the facets was suppressed. It was also observed that the deterioration of the facets of this semiconductor laser device was effectively suppressed and this semiconductor laser device attained stabilized oscillation even at operation of 50 mW at 50° C.

EXAMPLE 4

Figure 6:
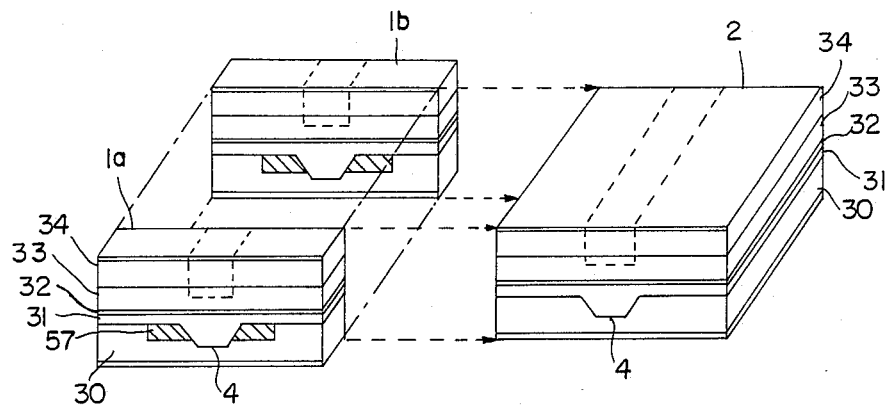
FIG. 6 is a perspective view showing the decomposition of another semiconductor laser device of this invention.

FIG. 6 shows another CSP semiconductor laser device of this invention, in which both edges of the channel 4 in the vicinity of the facets of the laser device are formed by an n-Ga$_{1-z}$Al$_z$As layer 57, the forbidden bandgap of which is greater than that of the Ga$_{1-x}$Al$_x$As active layer 32 (z>x), and both edges of the channel 4 at the inside of the facets are formed by the n-GaAs substrate 30. Thus, the light absorbance in the vicinity of the facets is decreased so that the deterioration of the semiconductor laser device can be suppressed. This semiconductor laser device is produced in a way such as that shown in FIGS. 5A to 5D, in which pits 6 are formed in the n-GaAs substrate 30 in the vicinity of the facets and the n-n-Ga$_{1-z}$Al$_z$As current blocking layer 57 is formed within the pits 6.

Figure 7A:
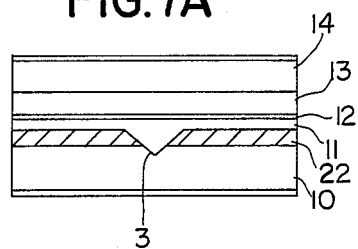
FIGS. 7A, 7B and 7C, respectively, are sectional views showing a conventional VSIS semiconductor laser device, a conventional CSP semiconductor laser device, and a conventional BTRS semiconductor laser device.
Figure 7B:
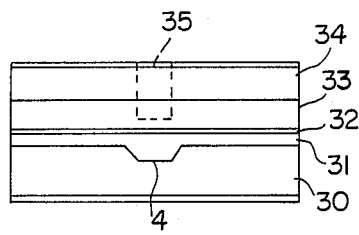
Figure 7C:
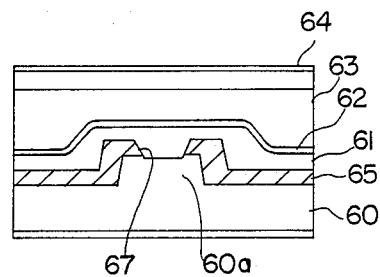

This invention is applicable to Inp-InGaAsP semiconductor laser devices with an inner stripe or the like other than the above-mentioned GaAs-GaAlAs semiconductor laser devices with an inner stripe. This invention is also applicable to BTRS semiconductor laser devices such as that shown in FIG. 7C, which can be also produced in the way such as that shown in FIGS. 5A to 5D. Moreover, although the abovementioned examples only disclose double-heterostructure semiconductor laser devices, this invention is applicable to semiconductor laser devices with optical waveguides of an LOC (large optical cavity) structure, an SCH (separate confinement heterostructure) structure, or the like, and semiconductor laser devices with a quantum well structure.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device, the combination of an active layer that constitutes a laser-oscillating resonator, and an inner-striped channel formed on a substrate in the resonating direction, light from said active layer being absorbed at both edges of said striped channel, resulting in an optical waveguide within said active layer, wherein the composition ratio of the mixed crystal constituting the edges of said striped channel in the vicinity of at least one of the light-emitting facets is different from that of the mixed crystal constituting the edges of said striped channel inside of the light-emitting facets, so that the amount of light to be absorbed at both edges of said striped channel in the vicinity of at least one of the light-emitting facets is smaller than that to be absorbed at both edges of said striped channel inside of the light-emitting facets.

2. An apparatus according to claim 1, wherein said mixed crystal constituting the edges of said striped channel in the vicinity of at least one of the light-emitting facets is GaAlAs and said mixed crystal constituting the edges of said striped channel inside of the light-emitting facets is GaAs.

* * * * *